United States Patent
Ogawa et al.

(10) Patent No.: US 7,868,245 B2
(45) Date of Patent: Jan. 11, 2011

(54) SOLAR PANEL AND PRODUCTION METHOD THEREFOR

(75) Inventors: Kazuhiko Ogawa, Nagasaki (JP); Yasuhiro Yamauchi, Nagasaki (JP); Tatsuji Horioka, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/502,657

(22) PCT Filed: Dec. 12, 2002

(86) PCT No.: PCT/JP02/13008

§ 371 (c)(1),
(2), (4) Date: Aug. 4, 2004

(87) PCT Pub. No.: WO2004/054002

PCT Pub. Date: Jun. 24, 2004

(65) Prior Publication Data

US 2005/0161075 A1 Jul. 28, 2005

(51) Int. Cl.
*H01L 31/00* (2006.01)
(52) U.S. Cl. .................. 136/251; 136/244; 136/256
(58) Field of Classification Search .............. 136/244, 136/251, 256; 257/433, 434, 443, 466; 438/80, 438/64, 66, 67, 71, 98
See application file for complete search history.

(56) References Cited

U.S. PATENT DOCUMENTS

| | | | | |
|---|---|---|---|---|
| 4,703,019 A | * | 10/1987 | Abe et al. ............... | 501/13 |
| 5,252,139 A | * | 10/1993 | Schmitt et al. ........... | 136/251 |
| 5,252,140 A | | 10/1993 | Yaba et al. | |
| 5,580,509 A | | 12/1996 | Van Den Berg et al. | |
| 6,300,556 B1 | * | 10/2001 | Yamagishi et al. ........ | 136/251 |
| 6,420,645 B1 | | 7/2002 | Fukae et al. | |
| 6,469,242 B1 | * | 10/2002 | Kondo ..................... | 136/251 |
| 2002/0139411 A1 | * | 10/2002 | Hiraishi et al. ........... | 136/244 |
| 2003/0079772 A1 | * | 5/2003 | Gittings et al. ........... | 136/251 |

FOREIGN PATENT DOCUMENTS

| | | | | |
|---|---|---|---|---|
| EP | 1039551 A2 | * | 9/2000 | |
| JP | 63-9160 A | * | 1/1988 | |
| JP | 5-299686 | | 11/1993 | |
| JP | 2001-053301 A | | 2/2001 | |
| JP | 2001-53320 | | 2/2001 | |
| JP | 2001053320 | * | 2/2001 | |
| JP | 2001-148496 | | 5/2001 | |
| SU | 421514 | * | 9/1974 | |

* cited by examiner

*Primary Examiner*—Jeffrey T Barton
(74) *Attorney, Agent, or Firm*—Oblon, Spivak, McClelland, Maier & Neustadt, L.L.P.

(57) ABSTRACT

A method is provided for producing a solar panel, which is made by building up a solar cell layer on a glass base as a covering glass, having a good performance in sealing the solar panel. A solar panel produce by the method is also provided. The production method of the present invention comprises a step of building up a solar cell layer which consists of a plurality of films on a glass substrate which is used as a covering glass, a step of removing a part of the solar cell layer which is built up on the glass substrate, a step of sealing the solar cell layer by using a face, which is exposed by the removing of the part of the solar cell layer, for adhering a sealing material.

4 Claims, 3 Drawing Sheets

SOLAR PANEL AND PRODUCTION METHOD THEREFOR

TECHNICAL FIELD

The invention relates to a solar panel and to a production method therefor.

BACKGROUND ART

Generally, a solar panel is made by building up a plurality of films such as a clear electrode film, a semiconductor film, and a metal electrode film on a base material FIG. 3 shows a production method for a conventional solar panel. A solar panel 10 is made by adhering a solar panel module 27, which is made by building up a solar cell layer 25 on a thin glass substrate (glass substrate 26), to a covering glass which is made of a glass substrate 15 by using an adhering sheet 14.

A covering sheet (back up sheet for rear face) 21 is adhered to the rear face, to which the solar cell layer 25 is arranged, of the solar panel 10 so as to cover the solar panel module 27 by an adhering sheet (adhering sheet having an adhering face in a rear face) 20. The periphery of the covering sheet is covered by a sealing material 22 so as to seal the solar cell layer 25.

FIG. 4 shows another production method of a conventional solar panel. In this method, a solar cell layer 25 is directly built on an entire surface of a glass substrate 15 for covering the solar cell layer 25, and is adhered to the covering sheet 21 by the adhering sheet 20. It is possible to obtain a solar panel having a desired dimension by cutting the solar panel thus constructed. The above production process has an advantage in flexibility of design.

However, a periphery of the covering glass 15 and an edge of the solar panel 25 are aligned approximately on the same line, and according to this alignment, productivity and quality of the solar panel will be degraded. That is, as shown in FIG. 5, it is necessary to arrange the sealing material 22 between a bottom face and an upper face of the solar panel so as to cover the edge of the solar panel and also to closely contact the covering glass 15 with the sealing material 22. According to the above necessities, the production process for the solar panel becomes too complex. Because the sealing material 22 is arranged to cover a part of the face of the covering glass 15, qualities such as appearance and amount of accepting light tend to be degraded. Because the sealing material 22 is arranged above the face of the covering glass 15 and a projecting portion 22c is formed by the covering glass 15, dust and contaminants tend to adhere and deposit on the covering glass 15.

DISCLOSURE OF THE INVENTION

The present invention has been made in view of the above problems and seeks to provide a method for producing a solar panel, which is made by building up a solar cell layer on a glass substrate as a covering glass, having a good performance in sealing the solar cell layer, and also to provide a solar panel made by the method.

One aspect of the present invention is a production method for the solar panel comprising a step of building up a solar cell layer which consists of a plurality of films, a step of removing a part of the solar cell layer and a step of sealing the solar cell layer using a surface of the solar cell layer, which is exposed by the removing step, as a face for adhering.

According to the above production process, the solar cell layer can be sealed by adhering the sealing material to the glass substrate using the surface of the solar cell layer which is exposed by the removing step. That is, it is possible to ensure a sufficient area for adhering the sealing material, and therefore, it is possible to seal the solar cell layer by using the area for adhering. The sealing material is arranged only in a bottom side of the glass substrate so as to seal the solar cell panel but is not necessary to arrange the sealing material in the upper side of the glass substrate. Therefore degrading of the quality of the solar panel, for instance an appearance, a reduction in quantity of light accepted by the solar panel, due to the sealing material which is adhered to the upper face of the glass substrate, and attaching and depositing of particles, are prevented.

In the step of removing a part of the solar cell layer, it is also possible to remove the entirety of the solar cell layer so as to expose a part of the surface of the glass substrate.

According to the face of the glass substrate thus exposed, it is possible to adhere the sealing material by using the face of the glass substrate, which has a good adhesion, so as to ensure sealing performance.

It is possible for the solar cell layer to comprise, in order from the glass substrate, an alkali barrier film, clear electrode film, semiconductor film and metal film, and the alkali barrier film is exposed by removing any of the films.

In this adhering, because the alkali barrier film which has a good adhesion is used as the adhering face, it is possible to ensure the sealing performance of the sealing material.

A further aspect of the present invention is that a solar panel comprises a solar cell layer which consists of a plurality of films which are built on a glass substrate for covering, and any of the plurality of films are removed so as to adhere a sealing material for sealing the solar cell layer by using a face which is exposed by the removal.

According to the face of the glass substrate thus exposed, it is possible to adhere the sealing material by using the face of the grass substrate, which has a good adhesion, so as to ensure a sealing performance.

It is possible for the above solar panel to expose a surface of the glass substrate by removing entire of said solar cell layer.

It is also available for the solar cell layer to comprise, in order from the glass substrate, an alkali barrier film, clear electrode film, semiconductor film and metal film, and the alkali barrier film is exposed by removing any of the films and is used as an adhering face to adhere the sealing material so as to seal the solar cell layer.

According to the solar panel and the production method of the present invention, it is possible to ensure sealing performance of the solar cell layer by using a surface, which is exposed by removing a part of the solar cell layer, as an adhering face for the sealing material.

BRIEF DESCRIPTION OF THE DRAWINGS

FIGS. 2A, 2B and 2C are schematic views of embodiments of the solar panel made by the production method of the present invention, wherein FIG. 2A shows a construction of a solar panel which solar cell layer is sealed by the sealing material using the surface of the glass substrate which is exposed by removing the solar cell layer, FIG. 2B shows a construction of a solar panel which solar cell layer is sealed by the searing material using the face of the alkali barrier film which is exposed by removing any of the films, FIG. 2C shows a construction of a solar panel which solar cell layer is sealed by two layers of sealing material by using the surface of the glass substrate which is exposed by removing any of films.

BEST MODE FOR CARRYING OUT THE INVENTION

Hereinafter, embodiments of the production method and the solar panel made by the production method of the present invention will be explained in reference with the figures.

FIGS. 1A to 1D show schematic views of a process of the production method of a solar panel of the present invention. In this embodiment, the production method consists of the following processes.

Figure 1A:
FIGS. 1A to 1D are schematic views of an embodiment of the production method of the present invention.

First process: As shown in FIG. 1A, building up a solar cell layer 25 which comprises a plurality of films.

Figure 1B:
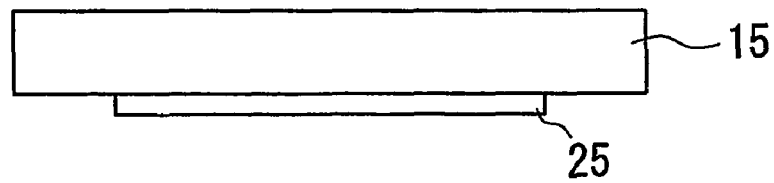

Second process: As shown in FIG. 1B, removing a part of the solar cell layer 25.

Figure 1C:
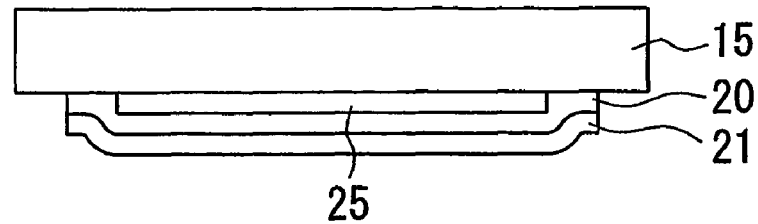

Third process: As shown in FIG. 1C, adhering a covering sheet 21 to the solar cell layer 25, which is built up on the glass substrate 15 for covering the face of the solar cell layer 25, by using an adhering sheet 20.

Figure 1D:
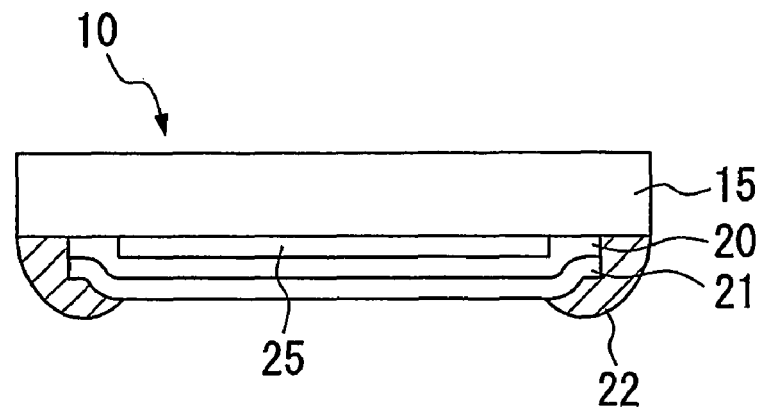

Fourth process. As shown in FIG. 1D, sealing the solar cell layer 25 by a sealing material 22 in order not to degrade a generating performance of the solar cell layer 25 due to absorption of moisture.

The solar cell layer 25 comprises, for instance, in order from the glass substrate 15, an alkali barrier film, a clear electrode film, a semiconductor film, and a metal film, and has a layered construction.

A method of a mechanical process and a method of a chemical process are available for removing any of the films of the solar cell layer 25. This method of removing the films using a mechanical process are, for instance, a method of grinding the films by a grinding wheel, a method of blasting, for instance a sand blasting, and a method of irradiating a laser beam, for instance, an excimer laser etc.

In this embodiment, a film in a periphery of the solar cell layer 25 is removed by using any of the above mechanical and chemical methods. If it is necessary to divide the entire solar cell layer 25 into several pieces, the periphery of the films to be removed are removed after cutting the glass substrate 15 for dividing the solar cell layer 25 into pieces of preferred dimensions. A preferable amount of an area to be removed in the solar cell layer 25 is sufficient for closely contacting a sealing material 22 to the solar cell layer 25.

The solar cell layer 25 is sealed by using the face, which is exposed by the above removing process, as an adhering face, and covering the peripheries of the solar cell layer 25, adhering sheet 20, and covering sheet 21. In this embodiment, an area for adhering the sealing material 22 to the glass substrate 15 is arranged by removing the solar cell layer 25; therefore, the sealing process is simplified. That is, by the process of this embodiment, because the solar panel can be sealed by supplying the sealing material 22 to one side (bottom side) of the glass substrate 15, a process of sealing can be completed more easily than the conventional process for sealing. The sealing material 22 is arranged in the bottom side of the glass substrate 15 so as to seal the solar cell panel and is not arranged in the upper side of the glass substrate 15. Therefore degrading of the quality of the solar panel, in appearance, and reducing the quantity of light accepted by the solar panel, due to the adhered sealing materials, and adhering and depositing of particles are prevented.

Figure 2A:
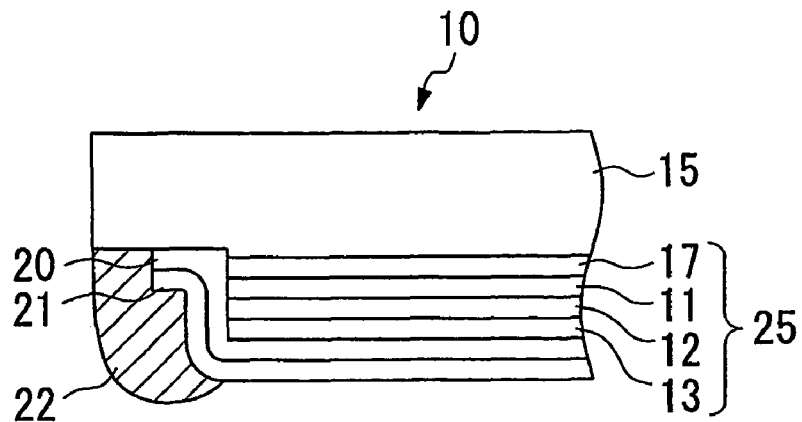
Figure 2B:
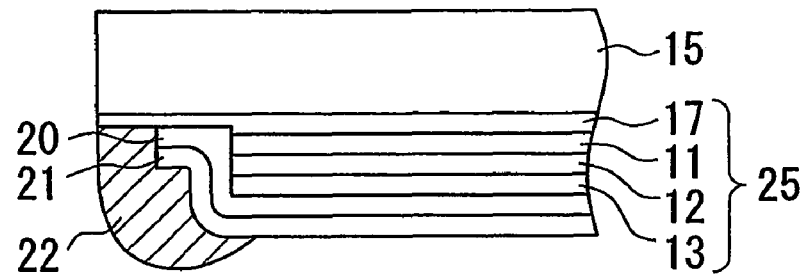
Figure 2C:
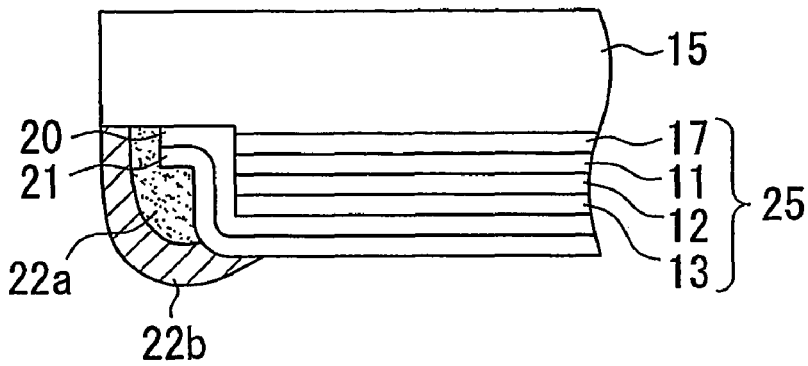
Figure 3:
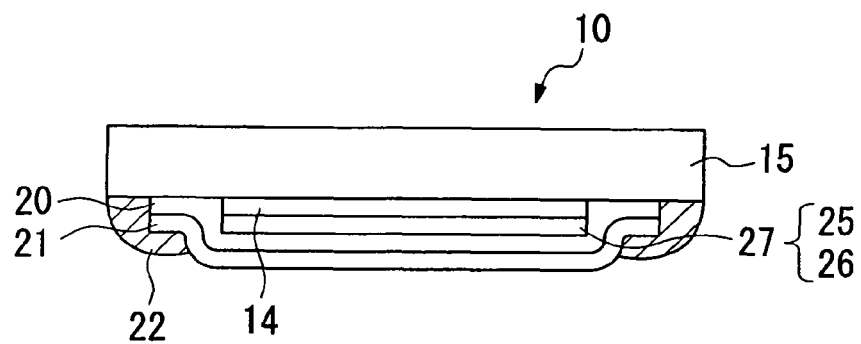
FIG. 3 is a schematic view of a solar panel which is made by a conventional production process.
Figure 4:
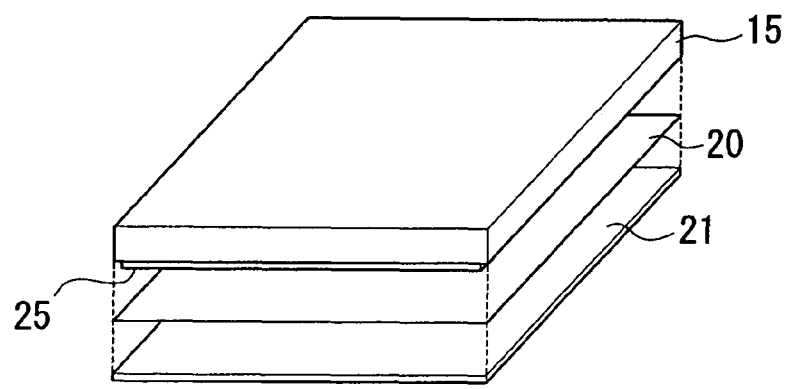
FIG. 4 is a schematic view of a conventional production process of a solar panel.
Figure 5:
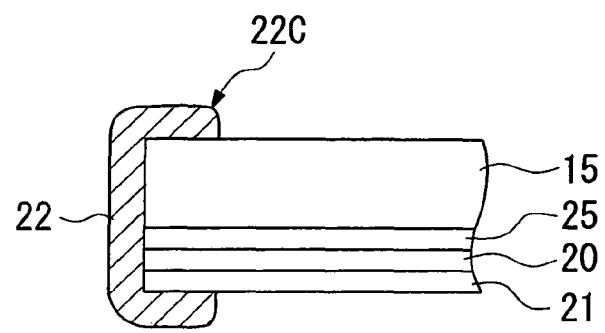
FIG. 5 is a schematic view of the solar panel made by the conventional production process.

FIGS. 2A to 2C show embodiments of a solar panel made by the process of the present invention. In these embodiments, the solar cell layer 25 has a build up construction which comprises, in order from the glass substrate 15, an alkali barrier film 17, a clear electrode film 11, a semiconductor film 12, and a metal film 13.

In the solar panel in FIG. 2A, a glass surface of the glass substrate 15 is exposed by the above exposing of the films, and the solar cell layer 25 is sealed by the sealing material 22 by using the exposed glass face for a face for adhering the sealing material 22 to the glass substrate 15.

In this embodiment, the glass surface which has a good adhesiveness is used as the adhering face to the sealing material 22 for sealing the solar cell layer 25. Therefore, the solar cell layer 25 can be certainly sealed by using the glass face of the glass substrate 15 which has a good adhesion. In the process of exposing, it is possible to ensure exposing the glass face by grinding not only the entirety of solar cell layer 25, but also a part of the glass substrate 15, to a predetermined depth.

In the solar panel of FIG. 2B, the alkali barrier film 17 is exposed by the exposing process, and the alkali barrier film 17 is adhered to the sealing material 22 so as to seal the other films, such as the clear electrode film 11, the semiconductor film 12, and the metal film 17.

In this embodiment, the solar cell layer 25 is also certainly sealed by the sealing material 22 by using the alkali barrier film 17, having a sufficient adhering performance, as an adhering face. The alkali barrier film 17, such as one of $SiO_2$, is arranged to prevent diffusion of an alkali, which is contained in the glass substrate 15, to the solar cell layer 25, and also to prevent degradation of the performance of the solar cell layer 25. Therefore the alkali barrier film 17 can be omitted, if the glass substrate 15 does not contain very much alkaline component.

In the solar panel of FIG. 2C, a first sealing material 22a is arranged which is adhered to the glass face which is exposed by the above exposing process using the glass face as an adhering face, and further to the first sealing material 22a, a second sealing material 22b is arranged for covering the first sealing material 22a. That is, the solar cell layer 25 is sealed by the first and second sealing materials 22a and 22b. A material having a good sealing performance due to low moisture permeability, such as materials in a series of butyl rubber and isobutylene-isoprene, is preferable for the first sealing material. A material having a good adhesion performance and a weatherproof performance, such as types of silicone rubber (general silicone sealant for construction), is preferable for the second sealing material 22b.

The solar cell layer 25 of the embodiments in FIGS. 2A to 2C ensures sealing performances due to the multiple sealing.

The solar panel made by the process of the above embodiments ensures sealing performance by using the face which is exposed by removing the solar cell layer for the adhering face to adhere to the sealing material. The exposed face is used for the adhering face for adhering to the sealing material; therefore, it is preferable to make the exposed face to be smooth so as to increase an adhering performance by the process for removing the solar cell layer. According to the exposed face thus smoothed, it is possible to increase an adhesiveness of the covering sheet 21 and the sealing material 22. In the above processes for removing the solar cell layer and increasing the smoothness of the exposed face, a process for increasing the smoothness of the exposed face can be performed by a means other than a means for removing the solar cell layer. For further increasing the adhering performance, it is preferable to coat the exposed face with primer materials in order to add further smoothness and adhesiveness to the exposed face.

The invention claimed is:

1. A solar panel, comprising:
    a covering-glass substrate having a first surface, a second surface, and a side surface extending between the first and second surface, the second surface having a periphery section and a solar cell layer section, the periphery section surrounding the solar cell layer section, the periphery section having a smaller thickness than the thickness of the solar cell layer section in a cross sectional view, the periphery section including a first portion and a second portion, at the periphery section the solar cell layer being reliably removed to ensure exposing a face of the covering-glass, the second portion surrounding the first portion, the first surface being directed to the sun, the second surface being subjected to have layers and films thereon;
    a solar cell layer including a plurality of films formed on the solar cell layer section of the second surface, the films including, in order from the substrate, a transparent electrode film, at least a semiconductor film, and a metal film;
    an adhering sheet on the first portion of the periphery section of the second surface, the adhering sheet covering the edges of the films and the surface of the metal film and being smaller than the covering glass substrate in a direction in which the first surface and the second surface extend in the cross sectional view perpendicular to the first surface and the second surface;
    a covering sheet on the adhering sheet, the covering sheet being in contact with the adhering sheet at the periphery thereof and being smaller than the covering glass substrate in a direction in which the first surface and the second surface extend in the cross sectional view perpendicular to the first surface and the second surface; and
    a sealing material sealing the second portion of the periphery section of the second surface and the peripheries of the adhering sheet and the covering sheet so as not to cover the first surface of the glass substrate, wherein the sealing material contacts a portion of each of the adhering sheet, the covering sheet, and the second surface of the substrate, surrounds the adhering sheet and the covering sheet, and does not contact the substrate except the second surface thereof,
    wherein no sealing material is present on the first surface of the glass substrate and side surface of the substrate.

2. A solar panel according to claim 1, wherein said sealing material includes a first sealing material and a second sealing material, and
    said first sealing material has a high sealing performance and said second sealing material has both a high adhesion performance and a weatherproof performance.

3. A production method for a solar panel comprising the steps of:
    preparing a covering-glass substrate having a first surface, a second surface, and a side surface extending between the first and second surface, the second surface having a periphery section and a solar cell layer section, the periphery section surrounding the solar cell layer section, the periphery section including a first portion and a second portion, the second portion surrounding the first portion, the first surface being directed to the sun, the second surface being subjected to have layers and films thereon;
    forming a solar cell layer including a plurality of films on the solar cell layer section of the second surface, the films including, in order from the substrate, a transparent electrode film, at least a semiconductor film, and a metal film;
    removing a part of said films and a part of said glass substrate so that the thickness of said glass substrate differs between a non-removed section and the removed section;
    disposing an adhering sheet on the first portion of the periphery section of the second surface, the adhering sheet covering the edges of the films and the surface of the metal film and being smaller than the covering glass substrate in a direction in which the first surface and the second surface extend in the cross sectional view perpendicular to the first surface and the second surface;
    disposing a covering sheet on the adhering sheet, the covering sheet being in contact with the adhering sheet at the periphery thereof and being smaller than the covering glass substrate in a direction in which the first surface and the second surface extend in the cross sectional view perpendicular to the first surface and the second surface; and
    sealing the second portion of the periphery section of the second surface and the peripheries of the adhering sheet and the covering sheet with a sealing material so as not to cover the first surface of the glass substrate, bringing the sealing material into contact with a portion of each of the adhering sheet, the covering sheet, and the second surface of the substrate, the sealing material surrounding the adhering sheet and the covering sheet, and the sealing material not contacting the substrate except the second surface thereof,
    wherein no sealing material is present on the first surface of the glass substrate and side surface of the substrate.

4. A production method for a solar panel according to claim 3 wherein the step of sealing includes:
    disposing a first sealing material; and
    disposing a second sealing material, wherein
    said first sealing material has a high sealing performance and said second sealing material has both a high adhesion performance and a weatherproof performance.

* * * * *